United States Patent
Costanzo et al.

(10) Patent No.: US 9,325,263 B1
(45) Date of Patent: Apr. 26, 2016

(54) SENSORLESS ROTOR ANGLE DETECTION CIRCUIT AND METHOD FOR A PERMANENT MAGNET SYNCHRONOUS MACHINE

(71) Applicant: STMicroelectronics S.r.l., Agrate Brianza (IT)

(72) Inventors: Dino Costanzo, Catania (IT); Giacomo Scelba, Caltagrione (IT); Giuseppe Scarcella, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 59 days.

(21) Appl. No.: 14/533,330

(22) Filed: Nov. 5, 2014

(51) Int. Cl.
*H02P 6/16* (2006.01)
*H02P 6/18* (2016.01)

(52) U.S. Cl.
CPC .................................. *H02P 6/18* (2013.01)

(58) Field of Classification Search
CPC ......... H02P 25/023; H02P 6/18; H02P 6/182; H02P 8/14; H02P 8/34; G01B 7/003
See application file for complete search history.

(56) References Cited

U.S. PATENT DOCUMENTS

| 8,384,338 B2 | 2/2013 | Lu et al. | |
| 2015/0326158 A1* | 11/2015 | Furlan | H02P 8/34 318/685 |

OTHER PUBLICATIONS

Cacciato, M. et al: "Comparison of Low-Cost-Implementation Sensorless Schemes in Vector Controlled Adjustable Speed Drives," SPEEDAM 2008, International Symposium on Power Electronics, Electrical Drives, Automation and Motion, IEEE, pp. 1082-1087.

Consoli, A., et al: "Phase Modulation-Based Technique for Saliency Position Estimation of IPMSMs," 2009 IEEE, pp. 2489-2495.

Consoli, A., et al: "Sensorless Rotor Position Estimation in Synchronous Reluctance Motors Exploiting a Flux Deviation Approach," IEEE Transactions on Industry Applications, vol. 43, No. 5, Sep./Oct. 2007, pp. 1266-1273.

Gong, L.M., et al: "Robust Initial Rotor Position Estimation of Permanent-Magnet Brushless AC Machines With Carrier-Signal-Injection-Based Sensorless Control," IEEE Transactions on Industry Applications, vol. 49, No. 6, Nov./Dec. 2013, pp. 2602-2609.

Ha, Jung-Ik, et al: "Sensorless Rotor Position Estimation of an Interior Permanent-Magnet Motor from Initial States," IEEE Transactions on Industry Applications, vol. 39, No. 3, May/Jun. 2003, pp. 761-767.

Hammel, Wolfgang, et al: "High-Resolution Sensorless Position Estimation Using Delta-Sigma-Modulated Current Measurement," 2011 IEEE, pp. 2717-2724.

(Continued)

*Primary Examiner* — Karen Masih
(74) *Attorney, Agent, or Firm* — Gardere Wynne Sewell LLP (57) ABSTRACT

An estimate of the initial position of a rotor is made by monitoring sensed motor current signals which are amplitude and phase modulated with the rotor flux position in response to a high frequency voltage signal injection. The motor current signals are envelope detected to determine zero crossing points. Samples are taken of the motor current signals at positive and negative offsets from the zero crossing point, with the samples processed to identify a direction of the rotor flux axis. Further samples of at least one motor current signal are taken with respect to a certain phase reference, and the samples compared to resolve a polarity of the rotor flux axis which is indicative of the angular position of the rotor.

28 Claims, 5 Drawing Sheets

(56) References Cited

OTHER PUBLICATIONS

Hammel, Wolfgang, et al: "Integration of Alternating Carrier Injection in Position Sensorless Control Without any Filtering," 2009 IEEE, pp. 3830-3638.

Hammel, Wolfgang, et al: "Position Sensorless Control of PMSM by Synchronous Injection and Demodulation of Alternating Carrier Voltage," 2010 IEEE, pp. 56-63.

Jang, Ji-Hoon, et al: "Analysis of Permanent-Magnet Machine for Sensorless Control Based on High-Frequency Signal Injection," IEEE Transactions on Industry Applications, vol. 40, No. 6, Nov./Dec. 2004, pp. 1595-1604.

Kim, Hyunbae, et al: "Carrier Signal Injection Based Sensorless Control Methods for IPM Synchronous Machine Drives," 2004 IEEE, pp. 977-984.

Ma, Zhixun, et al: "System-on-Chip Sensorless Control of PMSM Combining Signal Injection and Flux Observer," 2012 IEEE 7th International Power Electronics and Motion Control Conference—ECCE Asia, Jun. 2-5, 2012, Harbin, CN, pp. 1201-1205.

Raca, Dejan, et al: "A Comparative Analysis of Pulsating vs. Rotating Vector Carrier Signal Injection-Based Sensorless Control," 2008 IEEE, pp. 879-885.

Raca, Dejan, et al: "Carrier-Signal Selection for Sensorless Control of PM Synchronous Machines at Zero and Very Low Speeds," IEEE Transactions on Industry Applications, vol. 46, No. 1, Jan./Feb. 2010, pp. 167-178.

Sato, Sadayuki, et al: "Three Years of Industrial Experience With Sensorless IPMSM Drive Based on High Frequency Injection Method," 2011 IEEE, pp. 74-79.

\* cited by examiner

SENSORLESS ROTOR ANGLE DETECTION CIRCUIT AND METHOD FOR A PERMANENT MAGNET SYNCHRONOUS MACHINE

TECHNICAL FIELD

This disclosure relates generally to synchronous machines and, more particularly, to techniques for sensorless detection of rotor position in a permanent magnet motor.

BACKGROUND

Motors in the form of a Permanent Magnet Synchronous Machine (PMSM) are gradually replacing classic DC motor drives as well as other AC motor drives in a large number of industrial and domestic applications. This is due, at least in part, on increasingly stringent specifications on energy consumption with a view to sustainable development that tend to place other motor drives at a disadvantage with respect to PMSM drives. Those skilled in the art recognize a number of advantages with respect to the key features of a permanent magnet motor such as compactness, efficiency, power factor, robustness and reliability. Notwithstanding those advantages, a known drawback with respect to controlling such a motor is that a vector controlled PMSM drive needs to use an encoder or a resolver for correctly aligning the stator current vector (i.e., correctly detecting rotor position). Such an electromechanical position transducer is not typically present in low cost/low power DC motor drives or constant V/Hz induction motor drives. The inclusion of such a transducer presents a significant disadvantage to the adoption of a PMSM drive for use in low cost/low power applications.

The performance of sensorless PMSM drives depends on torque control capabilities as well as on position and speed estimation accuracy and bandwidth. There is accordingly a need in the art for a sensorless PMSM drive capable of operation at any speed (including low and zero speed) which includes functionality for making both initial and incremental rotor position detections.

SUMMARY

In an embodiment, a sensorless rotor angle detection circuit for a motor having multi-phase windings comprises: a current sensing circuit configured to sense current in plural motor phase windings; a first phase conversion circuit configured to convert a multi-phase current sense signal output from the current sensing circuit to a two-phase current signal; and a position detection circuit configured to process said two-phase current signal and determine a rotor angle of said motor. The processing of the two-phase current signal comprises: determining zero crossing points of an envelope of a first signal of the two-phase current signal, said zero crossings being indicative of rotor angle direction; sampling the first signal and a second signal of the two-phase current signal at positions positively and negatively offset from one of the zero crossing points to determine a direction of a rotor flux axis; sampling one of the first and second signals in correspondence with a phase reference to determine information indicative of the rotor angle.

In an embodiment, a method for sensorless detection of rotor angle for a motor having multi-phase windings comprises: sensing current in plural motor phase windings to provide a multi-phase current sense signal; converting said multi-phase current sense signal to a two-phase current signal; and processing said two-phase current signal to determine a rotor angle of said motor. The processing comprises: determining zero crossing points of an envelope of a first signal of the two-phase current signal, said zero crossings being indicative of rotor angle direction; sampling the first signal and a second signal of the two-phase current signal at positions positively and negatively offset from one of the zero crossing points to determine a direction of a rotor flux axis; sampling one of the first and second signals in correspondence with a phase reference to determine information indicative of the rotor angle.

The circuit and method may, for example, be configured to implement a control algorithm in software executed on a microcontroller or computer. Alternatively, the circuit and method may implement the control algorithm using analog signal circuitry.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Significant effort has been expended towards the development of a reliable, low cost control strategy for an AC motor drive that does not require a position transducer. Such control strategies, referred to in the art as 'sensorless' techniques, generally estimate the rotor position by processing electrical motor variables, such as phase stator currents and voltages.

The simplest sensorless techniques, based on rotor flux position estimation, integrate the back EMF of the motor. This approach is simple and effective, but fails when the machine is operating at low and zero speed because the motor back EMF is too low to effectively measure and the rotor flux estimation result is sensitive to stator resistance variations and measurement noises.

A closed loop rotor position observer has been also developed in order to decrease the sensitivity to parameter variations, while automatically performing the correct system initialization. However, this approach, as well as position estimation techniques based on stator phase voltage third harmonic or spatial phenomena inherent within the machine (such as rotor/stator eccentricities and winding asymmetries) cannot work at zero speed for the lack of useful signals to process.

Model Reference Adaptive Controller (MRAC), Kalman Filters, Luenberger Observers and other sensorless control schemes based on the application of sophisticated identification procedures allow, under some limitations, low and zero speed operations, but are too complex and expensive to be used in practical low cost systems.

Sensorless vector controlled alternating current (AC) motor drives are available in the market, with these products demonstrating the practical use of sensorless drive technology. Commercially available sensorless AC motor drives are mainly Direct Field Oriented Controlled (DFOC) induction motor drives, requiring only speed (not position as in the case of PMSM drives) estimation, or Direct Torque Control (DTC) drives that require only coarse position estimation. Such systems work in a speed range between 1% and 100% of the rated speed, featuring speed control accuracy as high as 5% of the base speed. Theses motors can favorably compete with constant Volt/Hertz configurations at low level and with standard Indirect Field Oriented Controlled (IFOC) induction motor drives at high level, although only at sufficiently high speed in the last case.

These sensorless AC drives show dynamic performance fairly approaching those of standard vector controlled drives, at least at speeds higher than 3-5% of the rated value. Below such a speed, however, the dynamic stiffness quickly decreases, making it impossible to perform speed control. The flux/rotor position is incrementally estimated with a typical accuracy of 8-12 bits, and this is sufficient to perform the vector control. Speed estimation features depend on the specific algorithm used but, again, the typical accuracy is 8-12 bits, allowing for the performance of speed control. Thus, these AC sensorless drives are not suitable to control shaft position, which requires an absolute shaft position estimation with 12-16 bits accuracy and a high bandwidth, as well as full torque control capability at zero speed.

Some known application fields of sensorless AC motor drives include: offset printing machines, manufacturing machines in the pulp and paper industry, iron industry and textile industry, movement of cranes, conveyors and trolleys, air conditioning systems, sealed compressors and submerged pumps.

Further development of sensorless AC motor drives will permit such drives to compete with standard vector controlled AC drives, thus showing full torque control at zero speed and at least 12 bits of absolute position estimation accuracy. Expected application fields include the same fields as noted above, although with improved dynamic performance and shaft position control capability.

Among sensorless AC drives, PMSM drives feature the maximum power density and are well suited for those applications where the weight and the shape of the motor are of concern. All of the aforementioned sensorless methods able to operate even at zero speed will also need to estimate the initial rotor position. A classification can be made according to the detection method. Techniques belonging to the indirect speed estimation category exploit the stator equations to estimate the amplitude, the angular position and/or the frequency of the rotor flux and the rotor voltage equations to calculate the speed. Indirect approaches generally show a good level of technological maturity and have been already introduced onto the market, being particularly suitable to equip medium-low performance drives, where compensation of parametric variations and low speed sustained operations are not required. When compared with traditional systems based on the constant Volt per Hertz (VbyF) techniques, that are naturally sensorless featuring a predictive speed control, induction motor drives based on indirect speed estimation feature superior dynamic performance and an higher speed control robustness.

The predominant indirect speed estimation techniques in the art can be grouped as follows:

Back EMF (BEMF) techniques: compute speed from the fundamental Back EMF and stator currents. These techniques feature a good dynamic response at speeds exceeding 10% of the rated speed. Below this value, a correct Back EMF estimation cannot be accurately performed.

Flux estimation techniques: compute speed from the rotor voltage equations. These techniques use full order observers, reduced order rotor flux observers or simple rotor flux calculators, as well as Kalman filters and adaptive observers to obtain flux and speed estimation in open or closed loop modes. Although such approaches lead to different performance, not always directly correlated to the complexity of the algorithm or to the required computation effort, the performance is satisfactory in the high-medium-low speed range. However, these approaches are not able to consistently estimate rotor speed at zero or very low stator frequency.

Model Reference Adaptive System (MRAS) technique: exploits the redundancy of two different models computing the same motor variables to estimate the speed. In its simplest form a MRAS scheme is composed of two rotor flux calculators. The first exploits a voltage and a current based flux model, while the second is based on a current model using the estimated speed as the input. The difference between the outputs of the two flux calculators is used to correct the estimated speed. Compared with previous approaches, this technique provides for improved speed estimation in the low speed range. However, the technique is not able to determine speed at low and zero speeds.

One type of direct sensorless speed estimation is based on the analysis of the harmonic content of some motor variables. This technique is almost motor parameter independent, but generally requires a heavier computational effort (for example, in comparison to indirect techniques). Direct estimation of the rotor speed is made possible by the presence in the harmonic spectrum of motor currents and voltages of components featuring an angular frequency multiple of the rotor speed. Such components are commonly generated on standard machines by parasitic motor saliencies, caused by rotor asymmetries, rotor eccentricity, rotor slotting and magnetic saturation.

A further distinction can be made among direct techniques using standard machine excitation and those introducing suitable test signals on standard current and voltages.

Estimation techniques using a standard excitation are based on the detection of stator voltage rotor slot harmonics. The speed can be determined by measuring the amplitude or the angular frequency of slot harmonics. However, there is a problem with extracting the harmonic components of the speed information from the whole harmonic content of the machine. Such components, in fact, feature a low amplitude and disappear at very low and zero speed. Moreover, their frequency ranges in a wide frequency interval, according to speed variations, making mandatory the introduction of adaptive PLL systems. In practice, application of such methods at low speed is a quite complex task, while at high speed indirect techniques give similar results, with a much lower amount of computations.

The direct speed estimation technique that exploits suitable HF test signals presents a solution for use at the low speed range. The technique based on HF signal injection, in theory, allows for making a precise estimate of the motor speed at any frequency and with a good bandwidth. However, some presented techniques, to be practical, require special rotor designs in order to introduce a kind of saliency on standard machines. This limits the applicability of these speed estimation techniques on standard AC motor drives.

For a PMSM, estimation of the initial rotor position at zero speed and at any load is critical. In particular, embodiments herein present an apparatus and process for estimating an initial rotor position for a PMSM sensorless vector-control drive. The proposed solution overcomes the drawbacks mentioned above and, in particular, provides an accurate estimation of the rotor position at standstill, thus avoiding any mechanical movement of the rotor. The technique is further applicable, without necessitating rotor standstill, in situations where a reference frame for measurement travels with a different speed than the rotor.

Figure 1:
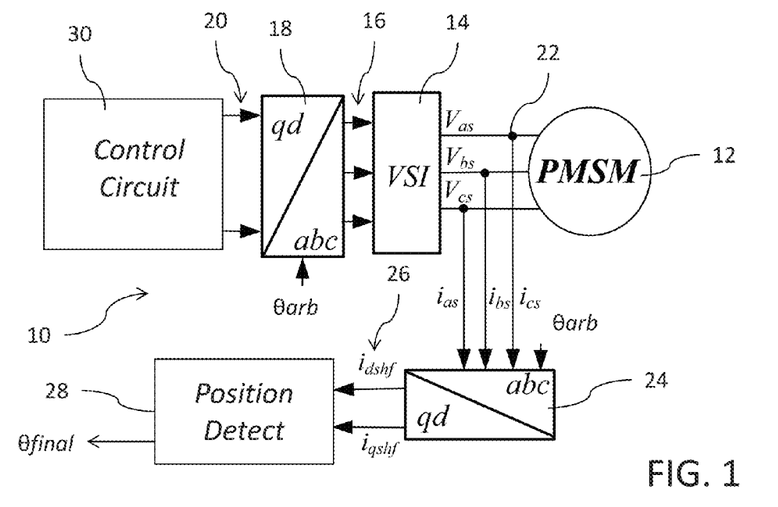
FIG. 1 is a block diagram of a sensorless vector-control drive for a Permanent Magnet Synchronous Machine (PMSM) motor.

Reference is now made to FIG. 1 showing a block diagram of a sensorless vector-control drive 10 for a Permanent Magnet Synchronous Machine (PMSM) motor 12. The motor 12 includes three motor phases (referred to as the "as" phase, the "bs" phase the "cs" phase (wherein each motor phase includes a motor winding connected to a common node in a "Y" configuration, as known in the art). The drive 10 includes a three-phase inverter (VSI) 14 configured to apply three corresponding voltage signals (Vas, Vbs and Vcs) to the three motor phases in response to three corresponding drive control signals 16. The three-phase inverter 14 may, for example, include three half-bridge drive circuits, wherein each half-bridge drive circuit receives one of the drive control signals 16 and generates one of the drive voltage signals (Vas, Vbs and Vcs). A phase conversion circuit 18 is provided to convert an input signal 20 from a two-phase (qd) frame of reference to a three phase (abc) frame of reference for said drive control signals 16. Such a phase conversion circuit 18 is known to those skilled in the art. The phase conversion circuit 18 operates with reference to an arbitrarily selected electrical angle (θarb) whose frequency is selected based on the magnetic structure of the motor. The frequency may, for example, comprise a frequency selected between 1 and 50 Hz.

Although the description herein is made with reference to a three-phase motor, it will be understood that the techniques disclosed herein are more generally applicable to multi-phase motors.

A control circuit 30 controls the configuration of the input signal 20 applied on the q and d axes. For example, the control circuit 30 may apply a zero magnitude signal to one of the q or d axes and a non-zero magnitude signal (DC or AC) on the other one of the q or d axes. The phase conversion circuit 18 and three-phase inverter 14 accordingly function in response to the input signal 20 to inject roto-pulsating high frequency flux into the motor 12.

A current sensing circuit 22 is provided for a plurality (but not necessarily all) of the motor phases to sense drive current and output corresponding drive current signals (ias, ibs, ics). The current sensing circuits 22 are illustrated, for convenience only, as nodes on the lines carrying the drive voltage signals (Vas, Vbs and Vcs) to the corresponding three terminals of the motor 12. Circuitry for performing such current sensing operations with respect to motor drive are well known to those skilled in the art. A phase conversion circuit 24 is provided to convert the drive current signals (ias, ibs, ics) from a three-phase (abc) frame of reference to a two-phase (qd) frame of reference to output high frequency current component signals (iqshf and idshf) 26. Such a phase conversion circuit 24 is known to those skilled in the art. The phase conversion circuit 24 operates, like that of the circuit 18, with reference to said arbitrarily selected electrical angle (θarb).

In an alternative embodiment, a single current sensing circuit 22 may be implemented to measure the individual motor currents using a technique known to those skilled in the art as a single common DC link current sensor.

Figure 2:
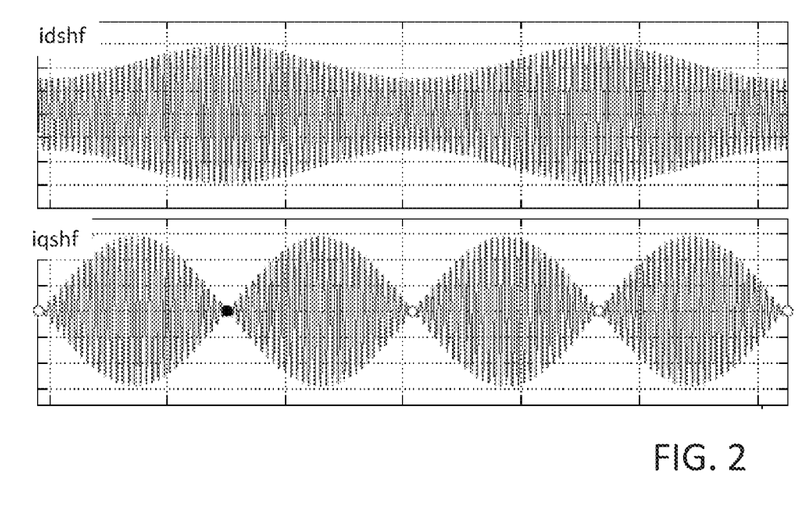
FIG. 2 illustrates the amplitude and phase modulation of the current components derived from sensed motor current through reference frame translation to an arbitrary angle.

The high frequency current components iqshf and idshf, calculated in a reference frame synchronous to the arbitrarily selected electrical angle θarb, are thus amplitude and phase modulated with the rotor flux position, as a consequence of the physical phenomenon of the flux deviation occurring in anisotropic motors. An example of such modulation is shown in FIG. 2. In this example, the d axis current component is modulated at twice the electrical angular position, and the orthogonal q axis current component is modulated at four times the electrical angular position. See, also, FIG. 5.

Figure 3:
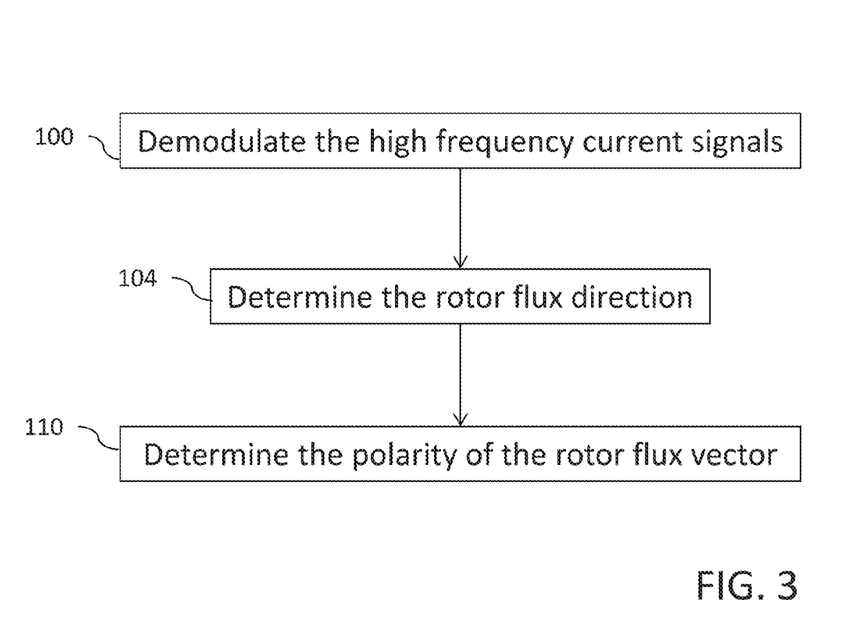
FIG. 3 is a block diagram of signal processing operations performed by a position detection circuit.

The drive 10 further includes a position detection circuit 28 that receives and processes the output current signals (iqshf and idshf) 26 and determines the position (θfinal) of the rotor for the motor 12. FIG. 3 illustrates a block diagram of the general signal processing operations performed by the position detection circuit 28.

Figure 4:
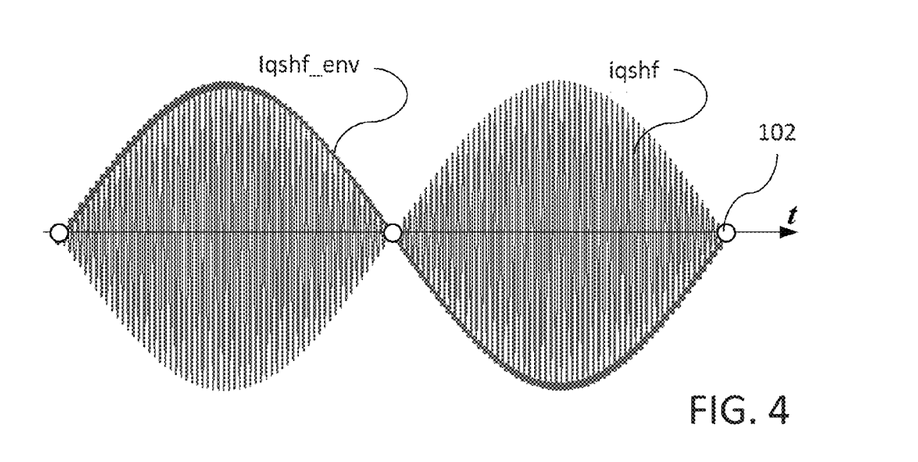
FIG. 4 illustrates a sampling and envelope detection operation.

In a first signal processing operation (reference 100), the control circuit generates signal 20 which comprises a first (for example, one of zero or non-zero) magnitude signal on the q axis and a second (for example, the other of zero or non-zero) magnitude signal (Vdshf) on the d axis. A roto-pulsating high frequency flux (synchronous to the arbitrarily selected electrical angle (θarb)) is injected into the motor 12 as a result of the operations performed by the phase conversion circuit 18 and three-phase inverter 14. One or more of the high frequency current signals, iqshf or idshf, are then demodulated by circuit 28 to extract information about flux deviation. Due to the flux deviation phenomenon, the high frequency current signals, iqshf or idshf, hold information about rotor angle displacement with respect to the injection angle θarb (and thus consequently about the rotor angle θfinal of the motor 12 itself). Taking the high frequency current signal iqshf, for example, the first signal processing operation 100 samples the current signal in correspondence of the zero crossing or a defined angle of the input non-zero voltage signal Vdshf (according to the resistor-inductor (RL) characteristic at the injection frequency of the motor 12). This signal Vdshf, as discussed above, is generated by the control circuit 30 and thus is known. A sign of the sampled current is alternately inverted (without any constraint in the initial polarity selection) so as to generate a low frequency current envelope signal iqshf_env (which is a function of rotor position) as shown in FIG. 4. This operation arises as a consequence of an assumption that the high frequency voltage Vdshf is 90° (or more precisely according to the RL characteristic of the motor at the injection frequency) phase shifted in advance with respect to the high frequency current iqshf.

It will be noted that the computational load required for performing the demodulation process (FIG. 3, reference 100) with respect to one or more of the high frequency current signals, iqshf or idshf, is considerably reduced by combining this sampling synchronization between the high frequency voltages and currents. Thus, the demodulation process permits implementation of sensorless control solutions, based on the injection of an additional high frequency magnetic field, with processing by a relatively lower performing microcontroller.

Figure 5:
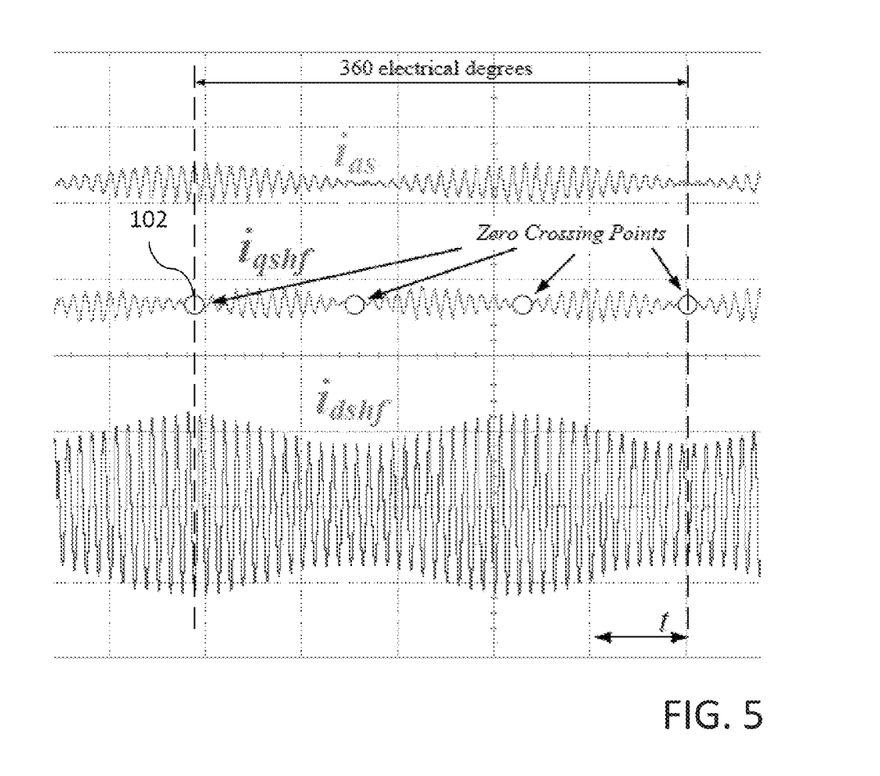
FIG. 5 shows current waveforms obtained by injecting a roto-pulsating high frequency magnetic field with respect to a motor operating at standstill (or when the high frequency test signal is injected on a reference frame that travels with a different speed than the rotor)

Reference is now made to FIG. 5 showing current waveforms with respect to the motor 12 operating, for example, at standstill (i.e., no rotation) during the operation 100. It will be understood that the waveforms of FIG. 5 are applicable as well to the situation where the high frequency test signal is injected on a reference frame that travels with a different speed from the rotor. The first waveform in FIG. 5 illustrates the sensed drive current signal for one phase of the motor 12 (in this case, for phase as showing the current ias). The second waveform in FIG. 5 illustrates the high frequency current signal iqshf. The third waveform in FIG. 5 illustrates the high frequency current signal idshf. It will be noted that the waveforms are illustrated for at least one entire electrical cycle (360°), and that within such one electrical cycle there are four zero crossing points 102 on the high frequency current signal iqshf. Thus, for an injection of the roto-pulsating high frequency flux into the motor 12 for a duration of at least one-fourth of the electrical period, the high frequency current signal iqshf will exhibit at least one minimum point (zero crossing) that is orthogonal to the injected current. The zero crossing point(s) provide(s) information indicative of the actual rotor flux position (θfinal) with a potential error of +90°, 180° or −90°. The next processing two steps operate to resolve the position ambiguity.

In a second signal processing operation (reference 104, for example carried out on data collected during the first phase), the control circuit generates signal 20 which comprises a zero magnitude signal on the q axis and a non-zero magnitude signal (Vdshf) on the d axis. A roto-pulsating high frequency flux (synchronous to the arbitrarily selected electrical angle ($\theta_{fictious}$) which can rotate clockwise or counter-clockwise with respect to the motor) is injected into the motor 12 as a result of the operations performed by the phase conversion circuit 18 and three-phase inverter 14. The angular position of the axis q and the axis d of the motor is discriminated by analyzing at least two samplings of both the high frequency current signals iqshf and idshf that are offset on either side of one zero crossing of the high frequency current signal iqshf identified in operation 100.

Figure 6:
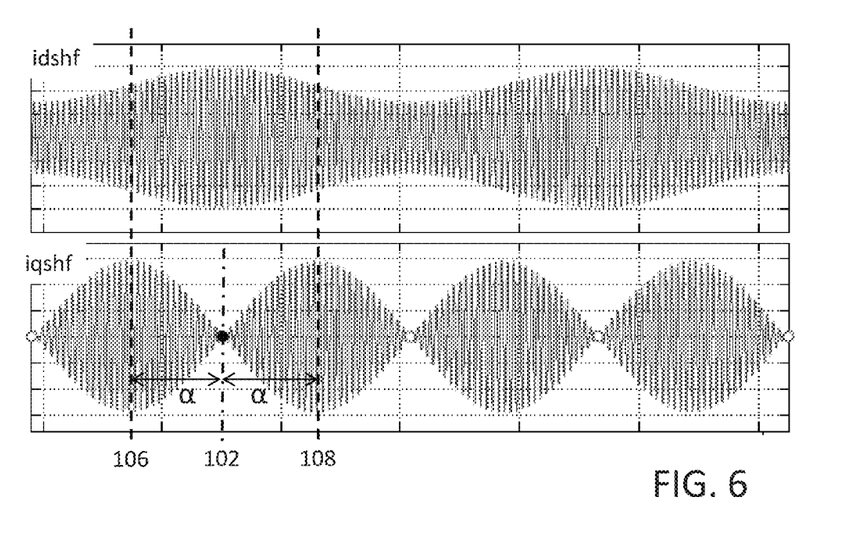
FIG. 6 illustrates the high frequency current signals with identified zero crossing and offset sampling locations.

In a preferred embodiment, the two samplings are taken simultaneously (or nearly simultaneously) offset from the identified zero crossing location by a sampling phase angle α. In a preferred implementation, α<90°, and in an example implementation, α=45°. The two samplings are accordingly made at the zero crossing angle minus α and at the zero crossing angle plus α. Reference is made to FIG. 6 showing the high frequency current signals iqshf and idshf, the identified zero crossing 102 of the high frequency current signal iqshf, and the locations 106 and 108 of the two samplings at the example implementation where α=45°. The sampling of the high frequency current signals iqshf and idshf can be performed, in a manner similar to that described above with respect to operation 100, synchronously to the applied high frequency voltage Vdshf.

At each sampling location, the process calculates a value c which is equal to the sign of the product of the sampled high frequency current signals iqshf and idshf in accordance with the following formula:

$$c=\text{sign}(iqshf \cdot idshf)$$

The process then compares the value of c for sampling location 106 (c106) to the value of c for the sampling location 108 (c108). It is assumed that the identified zero crossing location 102 is an initial estimated rotor position (θest). In the case where the arbitrarily selected electrical angle ($\theta_{fictious}$) rotates counterclockwise with respect to the rotor, if c106 and c108 are respectively positive and negative, then the corrected rotor position (θcor) is given by the initial estimated rotor position (i.e., θcor=θest). Conversely, if c106 and c108 are respectively negative and positive, then the corrected rotor position is given by the initial estimated rotor position plus 90° (i.e., θcor=θest+90°). On the other hand, in the case that the arbitrarily selected electrical angle ($\theta_{fictious}$) rotates clockwise with respect to the rotor, if c106 and c108 are respectively negative and positive, then the corrected rotor position is given by the initial estimated rotor position. Conversely, if c106 and c108 are respectively positive and negative, then a corrected rotor position (θcor) is given by the initial estimated rotor position plus 90° (i.e., θcor=θest+90°). Other results, i.e. c106 and c108 both positive or both negative, can be considered as errors in method application or signal measurement and decoding chain.

It will be noted that, for the process, when a zero crossing point has been detected in operation 100, the value of θarb in that instant is indicated θest.

Figure 7:
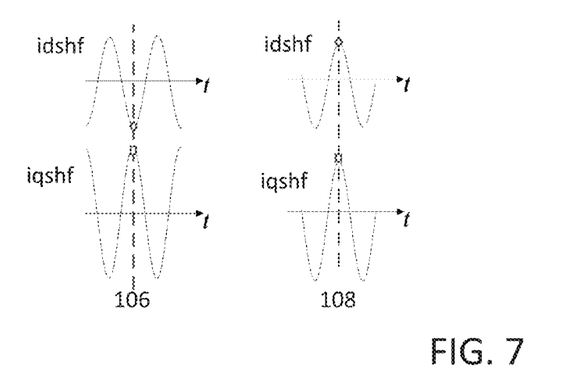
FIG. 7 illustrates details of the high frequency current signals at the sampling locations.

Reference is now made to FIG. 7 showing details of an example for the high frequency current signals iqshf and idshf at the sampling locations 106 and 108. In this example, assuming that the θarb is rotating counterclockwise, the sign of the product of the high frequency current signals iqshf and idshf at location 106 is "negative" and the sign of the product of the high frequency current signals iqshf and idshf at location 108 is "positive". So, in this example, the corrected rotor position θcor is given by the initial estimated rotor position plus 90° (i.e., θcor=θest+90°). If, on the other hand, both samples were like that illustrated on the right hand side of FIG. 7 (or both like that illustrated on the left hand side), then this would be an indication of errors in the method application or signal measurement and decoding chain.

The analysis performed with c106 and c108 allows for determining whether the identified zero crossing of the high frequency current signal iqshf occurs along the d or q axis. From this, one can know exactly the direction (but not polarity) of the rotor flux vector (θfinal). The foregoing arises from the following physical phenomenon: the different reluctance along the d (rotor flux direction) and q axes produces a phase displacement between the high frequency magneto motive force Fh and the corresponding flux λhf. In particular, Fh lags and leads alternatively the flux λhf, as can be seen in FIGS. 8A-8D. The processing performed in operation 104 exploits this phenomenon: the projection of the flux λhf along the estimated q' axis generates a high frequency current iqshf which is approximately in phase or in opposition to the current idshf, depending on the operating quadrant. From this analysis, a correction is made (if necessary) to the rotor position from the initial estimated rotor position at the zero crossing location.

Figure 8A:
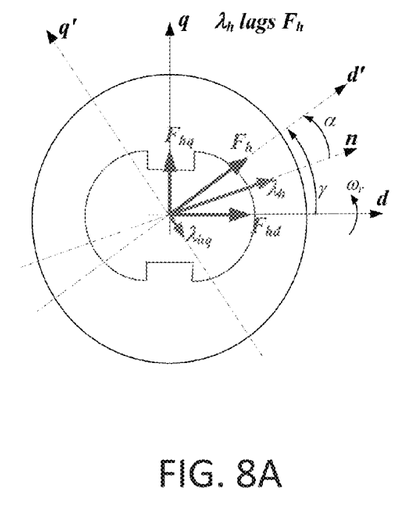
FIGS. 8A-8D illustrate the phase displacement between high frequency magneto motive force and corresponding flux.
Figure 8B:
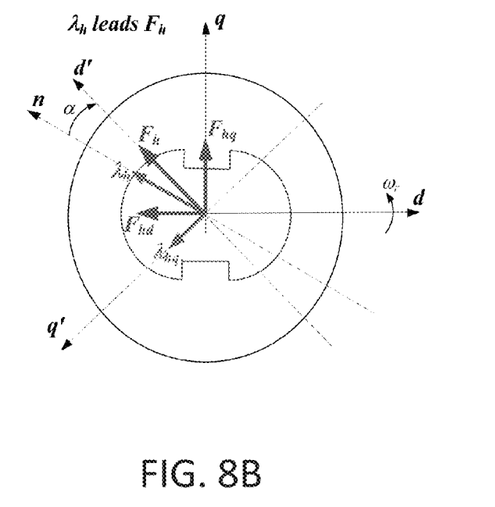
Figure 8C:
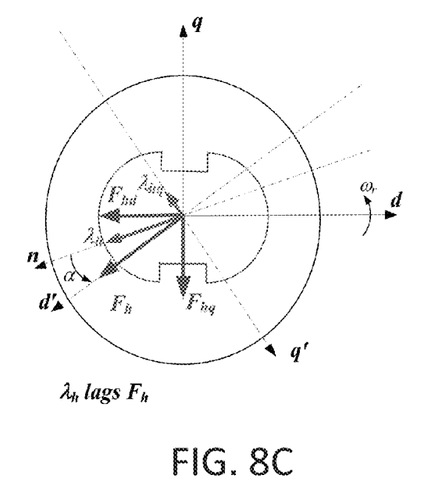
Figure 8D:
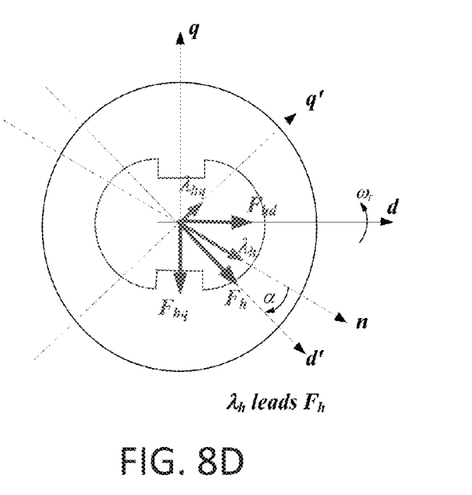

More specifically: FIG. 8A illustrates the condition where iqshf is 180° shifted with respect to idshf; FIG. 8B illustrates the condition where iqshf is 0° shifted with respect to idshf; FIG. 8C illustrates the condition where iqshf is 180° shifted with respect to idshf; and FIG. 8D illustrates the condition where iqshf is 0° shifted with respect to idshf.

The processing operation 104 advantageously requires only two samplings of high frequency current signals iqshf and idshf and the performance of only two tests in order to obtain the exact direction of the rotor flux vector. The process can be performed relatively quickly using simple computational techniques.

In a third signal processing operation (reference 110), the control circuit generates signal 20 which comprises an alternating non-zero magnitude signal (Vdshf) applied to the axis along the direction of rotor flux (as determined in operation 104) and a zero magnitude signal applied to the other axis. The polarity of the previously identified rotor flux vector (θcor) is then determined by monitoring the high frequency current signal for the corresponding axis. Thus, assume that the alternating non-zero magnitude signal (Vdshf) is applied to the d axis, then the high frequency current signal idshf is monitored.

Sampling of the high frequency current signal idshf can be performed as noted above synchronously to the applied high frequency voltage. More particularly, the high frequency current signal idshf is sampled at each zero crossing of the alternating non-zero magnitude signal (Vdshf). It is important to sample the high frequency current signal idshf in correspondence with a specific phase of applied high frequency voltage. The sampled values of signal idshf at odd zero crossings (first half phase) of the signal Vdshf are summed to produce a first summed value Σodd and the sampled values of signal idshf at even zero crossings (second half phase) of the signal Vdshf are summed to produce a second summed value Σeven. The first and second summed values (Σodd and Σeven) are then compared. If Σodd>Σeven, then a final rotor position is given by the corrected rotor position (from operation 104) minus 180°. Conversely, if Σeven>Σodd, then the first rotor position is given by the corrected rotor position.

Figure 9:
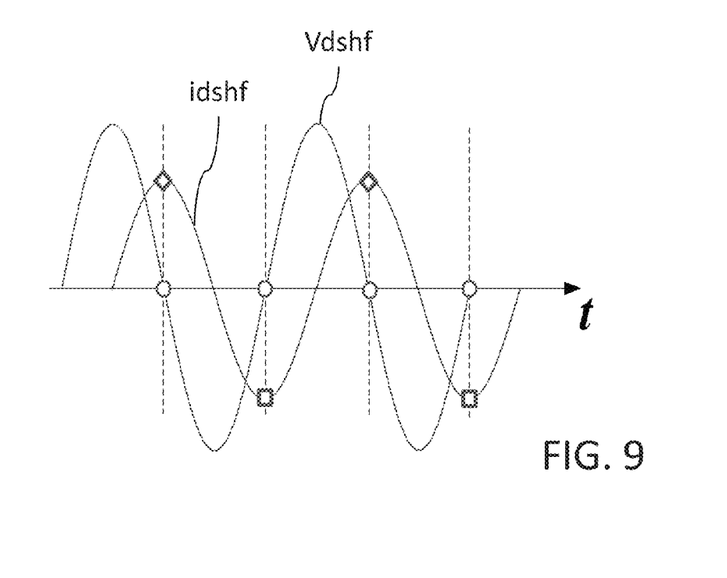
FIG. 9 illustrates sampling in support of determining rotor flux polarity.

Reference is now made to FIG. 9 showing details of an example for the phase relationship between the alternating non-zero magnitude signal Vdshf and the high frequency current signal idshf. The zero crossing points for the signal Vdshf are marked by a "○" symbol. Samples of the signal idshf made at odd zero crossing points are marked by a "◇" symbol. Samples of the signal idshf made at even zero crossing points are marked by a "□" symbol. The first summed value Σodd is equal to the summation of the ◇ samples (i.e., Σ◇), while the second summed value Σeven is equal to the summation of the □ samples (i.e., Σ□). The final rotor position is given by the following equations:

If Σ◇>Σ□; then θfinal=θcor−180°

If Σ◇<Σ□; then θfinal=θcor

The illustration in FIG. 9 shows an example where the Σ◇ is greater than the Σ◇, and so the corrected rotor position must be switched by 180° in order to produce the final rotor position. The final rotor position θfinal is output from the position detect circuit 28 (FIG. 1) for further processing in support of controlling operation of the motor 12. Conversely, if the signal idshf instead had the opposite phase from that illustrated in FIG. 9, the Σ◇ would be less than the Σ□, and so the final rotor position would equal the corrected rotor position.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A sensorless rotor angle detection circuit for a motor having multiple phase windings, comprising:
   a current sensing circuit configured to sense current in a plurality of the motor phase windings;
   a first phase conversion circuit configured to convert a multi-phase current sense signal output from the current sensing circuit to a two-phase current signal; and
   a position detection circuit configured to process said two-phase current signal and determine a rotor angle of said motor;
   wherein processing of the two-phase current signal comprises:
      determining zero crossing points of an envelope of a first signal of the two-phase current signal, said zero crossings being indicative of rotor angle direction;
      sampling the first signal and a second signal of the two-phase current signal at positions positively and negatively offset from one of the zero crossing points to determine a direction of a rotor flux axis;
      sampling one of the first and second signals in correspondence with a phase reference to determine information indicative of the rotor angle.

2. The circuit of claim 1, wherein the determined information is a polarity of the determined direction of the rotor flux axis, wherein said polarity is indicative of the rotor angle.

3. The circuit of claim 1, further comprising:
   a control circuit configured to generate said two-phase input signal;
   a second phase conversion circuit configured to convert the two-phase input signal to a multi-phase control signal; and
   a multi-phase inverter circuit configured to receive said multi-phase control signal and output a multi-phase motor drive signal for application to said multiple phase windings.

4. The circuit of claim 3, wherein the two-phase input signal generated by said control circuit is configured to inject a roto-pulsating high frequency stator flux in said motor, and said first and second signals of the two-phase current signal are amplitude and phase modulated with a position of said rotor flux.

5. The circuit of claim 3, wherein the phase reference is provided by an alternating voltage signal generated by the control circuit and applied to one phase of the two-phase input signal.

6. The circuit of claim 5, wherein the one phase of the two-phase input signal which receives the alternating voltage signal corresponds to a direction of rotor flux axis.

7. The circuit of claim 3, wherein the control circuit is configured to apply a zero magnitude signal as a first signal of the two-phase input signal and a non-zero magnitude signal as a second signal of the two-phase input signal.

8. The circuit of claim 7, wherein the first and second phase conversion circuits operate in a reference frame synchronous to an arbitrary angle.

9. The circuit of claim 1, wherein sampling the first signal and a second signal of the two-phase current signal comprises:
   sampling the first and second signals at a positive offset position;
   calculating a first sign of a product of the samples at the positive offset position;
   sampling the first and second signals at a negative offset position;
   calculating a second sign of a product of the samples at the negative offset position; and
   determining a corrected angle as equaling:
      an initial estimated angle if the first and second signs exhibit a first opposite relationship; and
      the initial estimated angle plus 90° if the first and second signs exhibit a second opposite relationship.

10. The circuit of claim 9, further comprising determining a fault if the first and second signs are the same.

11. The circuit of claim 1, wherein sampling one of the first and second signals in correspondence with a phase reference comprises sampling said one of the first and second signals at positions corresponding to a defined angle.

12. The circuit of claim 11, further comprising:
   determining whether a magnitude of the odd samplings exceeds a magnitude of the even samplings; and
      if so, then outputting the rotor angle equal to the direction of the rotor flux axis offset by 180°; and
      otherwise, outputting the rotor angel equal to the direction of the rotor flux axis.

13. The circuit of claim 11, wherein the defined angle corresponds to zero crossings of the phase reference.

14. The circuit of claim 1, wherein said processing of the two-phase current signal occurs when a rotor of said motor is at standstill.

15. A method for sensorless detection of rotor angle for a motor having multiple phase windings, comprising:
   sensing current in a plurality of motor phase windings to provide a multi-phase current sense signal;
   converting said multi-phase current sense signal to a two-phase current signal; and
   processing said two-phase current signal to determine a rotor angle of said motor;
   wherein processing comprises:
      determining zero crossing points of an envelope of a first signal of the two-phase current signal, said zero crossings being indicative of rotor angle direction;
      sampling the first signal and a second signal of the two-phase current signal at positions positively and negatively offset from one of the zero crossing points to determine a direction of a rotor flux axis;
      sampling one of the first and second signals in correspondence with a phase reference to determine information indicative of rotor angle.

16. The method of claim 15, wherein the information comprises a polarity of the determined direction of the rotor flux axis, wherein said polarity is indicative of the rotor angle.

17. The method of claim 15, further comprising:
   generating said two-phase input signal;
   converting the two-phase input signal to a multi-phase control signal; and
   generating a multi-phase motor drive signal for application to said multiple phase windings from said multi-phase control signal.

18. The method of claim 17, further comprising injecting a roto-pulsating high frequency stator flux in said motor in response to said two-phase input signal, wherein said first and second signals of the two-phase current signal are amplitude and phase modulated with a position of said rotor flux.

19. The method of claim 17, wherein the phase reference is provided by an alternating voltage signal applied to one phase of the two-phase input signal.

20. The method of claim 19, wherein the one phase of the two-phase input signal which receives the alternating voltage signal corresponds to a direction of rotor flux axis.

21. The method of claim 17, further comprising applying a zero magnitude signal as a first signal of the two-phase input signal and a non-zero magnitude signal as a second signal of the two-phase input signal.

22. The method of claim 21, wherein the first and second phase conversion circuits operate in a reference frame synchronous to an arbitrary angle.

23. The method of claim 15, wherein sampling the first signal and a second signal of the two-phase current signal comprises:
   sampling the first and second signals at a positive offset position;
   calculating a first sign of a product of the samples at the positive offset position;
   sampling the first and second signals at a negative offset position;
   calculating a second sign of a product of the samples at the negative offset position; and
   determining a corrected angle as equaling:
      an initial estimated angle if the first and second signs have a first opposite relationship; and
      the initial estimated angle plus 90° if the first and second signs have a second opposite relationship.

24. The method of claim 23, further comprising identifying a fault if the first and second signs are the same.

25. The method of claim 15, wherein sampling one of the first and second signals in correspondence with a phase reference comprises sampling said one of the first and second signals at positions corresponding a defined angle.

26. The method of claim 25, further comprising:
   determining whether a magnitude of the odd samplings exceeds a magnitude of the even samplings; and
   if so, then outputting the rotor angle equal to the direction of the rotor flux axis offset by 180°; and
   otherwise, outputting the rotor angel equal to the direction of the rotor flux axis.

27. The method of claim 25, wherein the defined angle corresponds to zero crossings of the phase reference.

28. The method of claim 15, wherein said processing of the two-phase current signal occurs when a rotor of said motor is at standstill.

* * * * *